United States Patent
Kelberlau

(10) Patent No.: US 7,259,440 B2
(45) Date of Patent: Aug. 21, 2007

(54) FAST SWITCHING DIODE WITH LOW LEAKAGE CURRENT

(75) Inventor: Ulrich Kelberlau, Lampertheim (DE)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 11/088,009

(22) Filed: Mar. 22, 2005

(65) Prior Publication Data

US 2005/0218430 A1 Oct. 6, 2005

Related U.S. Application Data

(60) Provisional application No. 60/558,354, filed on Mar. 30, 2004.

(51) Int. Cl.
*H01L 23/58* (2006.01)

(52) U.S. Cl. .................. 257/493; 257/492; 257/144; 257/152; 257/487

(58) Field of Classification Search ............... 257/493, 257/492, 144, 152, 487
See application file for complete search history.

(56) References Cited

U.S. PATENT DOCUMENTS 5,747,872 A 5/1998 Lutz et al.

6,358,825 B1 * 3/2002 Hao et al. ............... 438/543
6,429,501 B1 * 8/2002 Tsuchitani et al. ......... 257/493
6,707,131 B2 3/2004 Kitamura et al.

OTHER PUBLICATIONS

Kwon et al., "Properties of Platinum-Associated Deep Levels in Silicon," *J. Appl. Phys.* 61(3), Feb. 1, 1987, 1055-1058.
Zimmerman et al., "Observation of Inverse U-Shaped Profiles After Platinum Diffusion in Silicon," *Appl. Phys. Lett.*, vol. 59, No. 10, Sep. 2, 1991, pp. 1209-1211.

* cited by examiner

*Primary Examiner*—Long Pham
(74) *Attorney, Agent, or Firm*—Townsend & Townsend & Crew LLP

(57) ABSTRACT

A fast switching diode includes an n– layer having an upper surface and a lower surface and a first edge and a second edge, the second edge provided on an opposing side of the first edge. A converted region is provided proximate the upper surface of the n– layer. The converted region includes platinum and has a first depth. The converted region has a platinum concentration that is substantially greater than an n-type dopant concentration in the converted region. First and second n+ regions are provided proximate the first and second edges of the n– layer, respectively, and extend from the upper surface of the n– layer to second and third depths, respectively. Each of the second and third depths is greater than the first depth to reduce leakage current. A first electrode is provided proximate the upper surface of the n– layer. A second electrode is provided proximate the lower surface of the n– layer.

13 Claims, 3 Drawing Sheets

FAST SWITCHING DIODE WITH LOW LEAKAGE CURRENT

CROSS-REFERENCE TO RELATED APPLICATION

The present application claims priority to U.S. Provisional Application No. 60/558,354, filed on Mar. 30, 2004, which is incorporated by reference.

BACKGROUND OF THE INVENTION

The present invention relates to a power semiconductor device, in particular to a fast switching diode.

When a pn-diode is conducting a forward current, electrons and holes are injected from the highly doped n+ and p+ surface layers into the n– layer. These injected carriers increase the concentration of mobile charges and thereby increase the conductivity of the n– layer. This conductivity modulation is necessary to reduce the voltage drop of a diode in the forward conducting mode.

When the applied voltage is reversed, the diode has to block the current flow. A depletion layer spreads from the pn-junction into the n– layer, building up an electric field, which supports the reverse voltage.

The transition between forward conducting and reverse blocking mode has a certain time delay during which time a short reverse current peak is flowing. These characteristics are specified with the parameters "Reverse Recovery Time" trr, "Reverse Recovery Current" Irrm and "Reverse Recovery Charge" Qrr. For fast recovery diodes all these parameters are expected to be as small as possible. However, a fast switching capability of a diode is generally accompanied with an increased forward voltage drop Vf, so that one has to find a compromise for a specific application of the diode.

The switching speed of a pn-diode can be increased (i.e., trr, Irr and Qrr can be reduced) by introducing recombination centers into the silicon crystal, where the injected electrons and holes can recombine. Recombination centers are generally defined using heavy-metal atoms, such as gold or platinum. Sometimes crystal defects are created within the substrate for this purpose. The crystal defects are created by irradiating the substrate with high energy particles, e.g., electrons or helium atoms. The higher the concentration of recombination centers, the smaller is the carrier lifetime and consequently the trr.

BRIEF SUMMARY OF THE INVENTION

In one embodiment, a fast recovery diode includes a first n-type layer having a first conductivity, the first n-type layer having an upper surface and a lower surface and a first edge and a second edge, the second edge provided on an opposing side of the first edge; a first p-type region provided proximate the upper surface of the first n-type layer, the first p-type region having a first depth, the first p-type region including platinum; a first n-type region provided proximate the first edge of the first n-type layer and extending from the upper surface of the first n-type layer to a second depth, the second depth being greater than the first depth to reduce leakage current; a first electrode provided proximate the upper surface of the first n-type layer; and a second electrode provided proximate the lower surface of the first n-type layer.

The diode further includes a second n-type layer having a second conductivity provided between the first n-type layer and the second electrode, wherein the second n-type layer has a higher conductivity than the first n-type layer, wherein the first and second n-type layers define a substrate, the first n-type layer has less conductivity than the second n-type layer, and wherein the first n-type region is a channel stopper.

In another embodiment, a fast switching diode includes an n– layer having an upper surface and a lower surface and a first edge and a second edge, the second edge provided on an opposing side of the first edge; a converted region provided proximate the upper surface of the n– layer, the converted region including platinum and having a first depth, the converted region having a platinum concentration that is substantially greater than an n-type dopant concentration in the converted region; first and second n+ regions provided proximate the first and second edges of the n– layer, respectively, and extending from the upper surface of the n– layer to second and third depths, respectively, the second and third depths each being greater than the first depth to reduce leakage current; a first electrode provided proximate the upper surface of the n– layer; and a second electrode provided proximate the lower surface of the n– layer.

In yet another embodiment, a method for making a fast switching diode comprises providing an n– layer having an upper surface and a lower surface and a first edge and a second edge, the second edge provided on an opposing side of the first edge; forming a converted region provided proximate the upper surface of the n– layer, the converted region including platinum and having a first depth, the converted region having a platinum concentration that is substantially greater than an n-type dopant concentration in the converted region; forming first and second n+ regions provided proximate the first and second edges of the n– layer, respectively, and extending from the upper surface of the n– layer to second and third depths, respectively, the second and third depths each being greater than the first depth to reduce leakage current; forming a first electrode provided proximate the upper surface of the n– layer; and forming a second electrode provided proximate the lower surface of the n– layer.

DETAILED DESCRIPTION OF THE INVENTION

Figure 1:
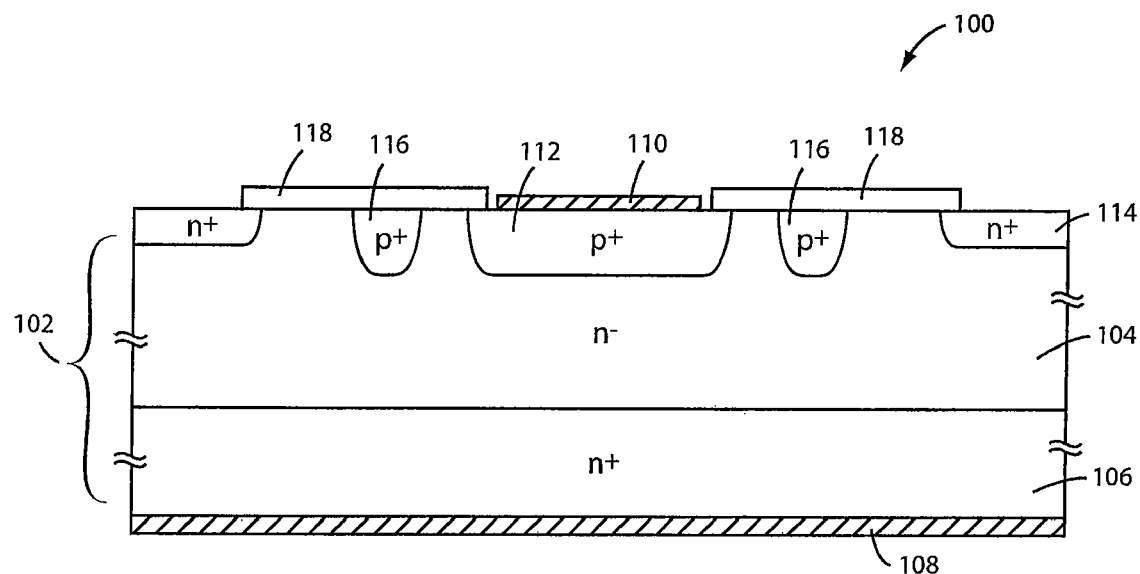
FIG. 1 illustrates a Pt doped fast recovery diode (FRED) with a moderate Pt-concentration.

The present invention relates to a fast switching diode. FIG. 1 illustrates a diode 100 including a substrate 102. The substrate has an n– type region or layer 104 and an n+ region or layer 106 that is provided below n– region 104. The n+ region 106 can be the substrate of an epi-wafer or a diffused layer. The substrate is a semiconductor substrate, e.g., silicon.

Diode 100 further includes a cathode electrode 108 on the lower side of n+ region 106. An anode electrode 110 is provided over the upper side of n− region 104. Proximate the upper side of n-region 104, a p+ doped emitter region 112, which is in contact with the anode, is provided. An n+ doped region 114 is formed at the edge of the die. This region 114 is used as a channel stopper. The n+ region 114 is used to prevent the formation of a leakage current path to the edge of the die. Ionic contamination in the passivation layer 118 or interface charges between the passivation layer 118 and n− layer 104 can induce a surface channel with increased conductivity, where a leakage current can flow. Since most of the current flows on or close to the upper surface of the n− layer 104, the n+ region 114 may be relatively shallow. In one application, the depth of the n+ region 114 is 1-2 microns.

Optionally, the diode may include one or more guard rings 116 that surrounds emitter region 112 for high blocking voltages. Alternatively, field plates may be used in place of guard rings, or they both may be used. A passivation layer 118 covers the surface between the emitter region and the n+ region 114.

Figure 2:
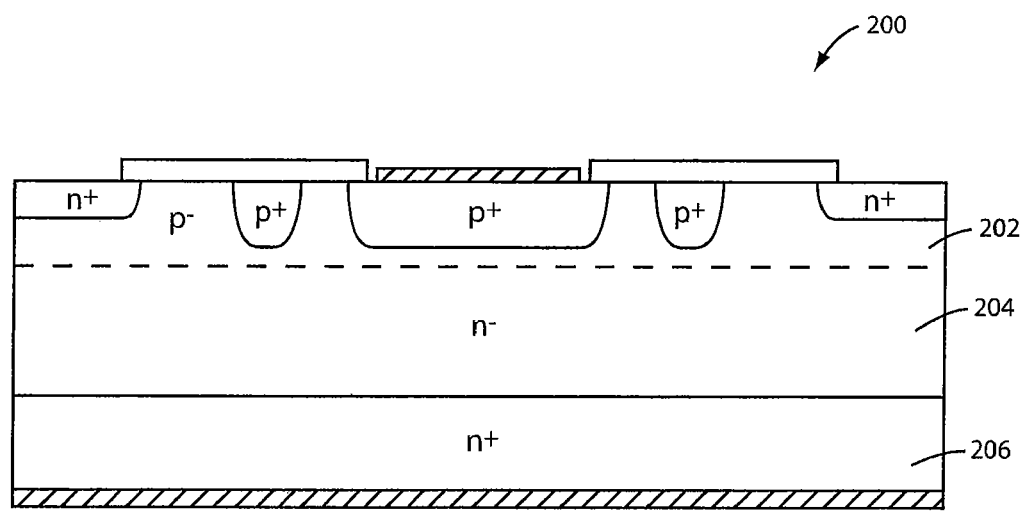
FIG. 2 illustrates a Pt doped fast recovery diode (FRED) with a high Pt-concentration

For a fast switching diode (also referred to as a "fast recovery diode"), the recombination centers are provided within the substrate 102 to shorten the lifetime of minority carriers. In one application, diode 100 is moderately doped with Pt, so that n− region 104 does not include a converted region. FIG. 2 illustrates a fast switching diode 200 that has a converted region 202 for faster switching capability. The converted region is a p− region due to high concentration of Pt on the upper part of the n− region 104. The Pt-doping concentration is increased by increasing the temperature and/or the time of the Pt-diffusion.

One method of defining such recombination centers is by doping platinum (Pt) into the substrate, e.g., by diffusion. The Pt-doping process usually includes forming a Pt-diffusion source that is followed by an in-diffusion step (or drive-in step) at a certain temperature for a given time.

The diffusion source can be a thin layer of platinum-silicide, which is formed on a surface of the wafer. The silicide is formed by sputtering a layer of Pt with a certain thickness onto the silicon substrate, and then heating the wafer to a temperature. The platinum atoms react with the silicon atoms and form a platinum silicide.

The in-diffusion of the Pt into the silicon is done at a higher temperature than the silicidation. During the diffusion process, the platinum does not form a uniform or homogeneous doping concentration with respect to the depth into the silicon wafer, but normally form "U-shaped" profiles.

The concentration of Pt within the silicon wafer increases with the increase of diffusion-time and temperature. The concentration of Pt within the substrate generally corresponds to the switching speed of the diode. Consequently, the switching speed of the diode can be adjusted by varying the Pt-diffusion temperature as well as the diffusion time. A very high concentration of Pt may convert an n-type silicon crystal to p-type (see FIG. 2), e.g., when the concentration is of Pt is twice or more than that of n-type concentration at n− region 104.

Figure 3:
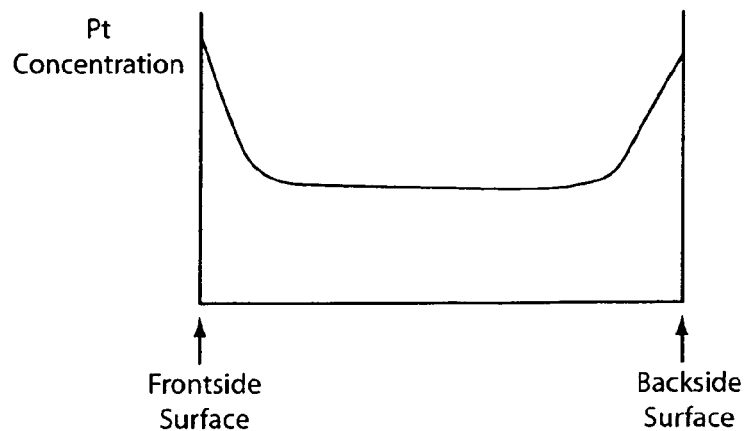
FIG. 3 illustrates a Pt-concentration profile vs. depth according to one embodiment.

FIG. 3 illustrates a Pt doping concentration profile obtained on the substrate. The Pt concentration is high at the surface of the substrate (i.e., the upper surface of n− region 104). The concentration steeply decreases with the increase in depth. At a given depth within the bulk substrate, the Pt-concentration versus depth remains rather flat. The concentration versus depth then steeply increases near the backside surface.

Generally, Pt-doped fast recovery diodes (FREDs) have very low leakage currents, especially at elevated temperature in comparison to Au-doped FREDs. This is a result of the higher activation energy for the thermal generation of electron-hole-pairs in Pt-doped silicon.

The inventor, however, has observed that certain fast Pt-doped diodes show increased leakage currents even at room temperature and at low reverse bias voltages. Such diodes are produced using high Pt-diffusion temperatures, e.g., 930° Celsius, and consequently have very high Pt-concentrations and configured to be extremely fast switching diodes. For example, diode 200 illustrates such a FRED that shows increased leakage current.

In addition, the phenomenon of the increased leakage current is dependent not only on the Pt-concentration in n− region 204, but also on the doping concentration of the n− region. If a diode is designed for a high blocking voltage (e.g., 1200 V), the n− region should have a low doping concentration, whereas a diode designed for lower blocking voltages (e.g., 200 V) can have much higher doping concentration in the n− region. Therefore, the Pt-concentration level that is necessary to cause the formation of the p-type region 202 is higher in the case of a diode with lower blocking voltage.

However, diodes with lower blocking voltage are often configured to have faster switching speed as compared to high voltage diodes, so that the lower voltage diodes need to have a higher Pt-concentration. For both types of diodes, the extremely fast diodes, i.e., ones with converted p− regions, may experience the increased leakage current problem.

One could try to avoid the formation of the p-type region 202 by reducing the Pt-concentration profile at the upper surface of the diode and make the Pt profile more uniform. This may not be desirable because a non-uniform Pt-distribution with a higher concentration near the upper surface, especially at the pn-junction, contribute to a better switching characteristic (or a soft recovery). Accordingly, the reducing the Pt concentration profile at the upper surface has negative consequences.

Figure 4:
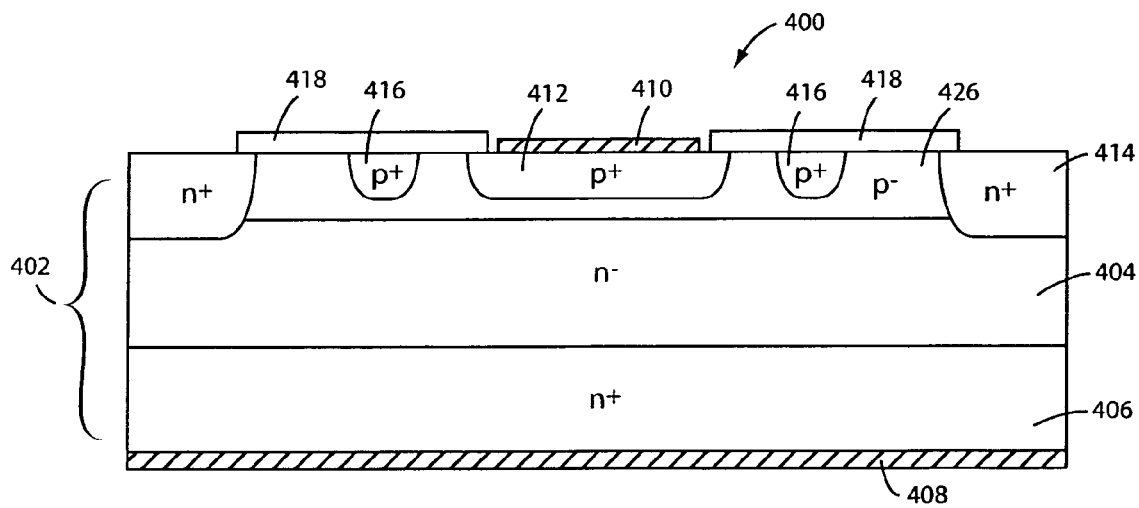
FIG. 4 illustrates a cross-sectional view of a fast recovery diode (FRED) according to one embodiment of the present invention.

FIG. 4 illustrates a fast switching diode 400 according to one embodiment of the present invention. Diode 400 is configured to provide a very fast switching capability with very low current leakage. Diode 400 includes a substrate 402. The substrate has an n− type layer 404 and an n+ layer 406 below the n− region. The n− layer 404 may be an epi layer grown on top of the n+ layer 406. The n− layer has a dopant concentration level of in the range of 1E13 cm-3 to 5e15 cm-3 depending on the blocking voltage that the diode is designed to handle. The n+ layer 406 can be the substrate of an epi-wafer or a diffused layer. The n+ layer has a dopant concentration of in the range of 5E18 cm-3 to 5e19 cm-3. The dopant concentration may vary according to application. The substrate is a semiconductor substrate, e.g., silicon.

Diode 400 further includes a cathode electrode 408 on the lower side of n+ layer 406. An anode electrode 410 over the upper side of n− layer 404. These electrodes are generally metals, e.g., aluminum. Proximate the upper side of n− layer 404, a p+ doped emitter region 412, which is in contact with the anode, is provided. The p+ region is a diffused region and has a dopant concentration at the surface of in the range of 5E17 cm-3 to 1e20 cm-3. The dopant concentration may vary according to application. An n+ doped region 414 is formed at the edge of the die. This region 414 is used as a channel stopper and has a dopant concentration at the surface of 5E17 cm-3 to 1e20 cm-3. The depth of the n+ region is provided to extend deeply into the n− layer 406 to reduce leakage current, as explained in more details later.

Optionally, the diode may include one or more guard rings 416 that surrounds emitter region 412 for high blocking voltages. Alternatively, field plates may be used in place of guard rings, or they both may be used. A passivation layer 418 covers the surface between the emitter region and the channel stopper.

The recombination centers are provided within the substrate 402 to shorten the lifetime of charge carriers. The recombination centers are created by doping the substrate with heavy metal or creating crystal defects on the substrate.

In the present implementation, platinum is doped into the substrate to create a converted region 426 that is p− region. The upper surface of the n− layer 404 is converted to p− region by providing that region with higher Pt concentration than that of the n-type dopant concentration. At the upper surface of the diode, according to the application, the concentration of platinum is twice or more, or three times or more, or four times or more than the n-type dopant concentration. Generally, the concentration of Pt needs to be substantially greater than that of the n-type dopant concentration to convert the n− region to a p− region since not all Pt atoms functions as p-type dopants.

The p-type region 426 forms a conductive current path between the p+ emitter region 412 and the edge of the die. The outer edge of the die is formed by cutting a wafer with a sawing machine, and there is a lot of crystal damages. A passivation layer is generally not provided thereon. The inventor has discovered that the leakage current can flow from the anode contact 410, through the p-type region 426, along the outer edges of n− layer 404 and n+ layer 406, and then to cathode 408.

Diode 400 is configured to prevent this leakage current by interrupting the leakage current path above. This is done by making the channel stopper 414 extend beyond the depth of p− region 426, as shown in FIG. 4. In one implementation, the channel stopper is provided to be 15 microns deep, whereas the p− region is 10 microns deep. As a result, the channel stopper interrupts the current leakage path between the p− region 426 and the edges of n− layer 404 and n+ layer 406. The n+ region may be 1 micron, or 2 microns, or 3, microns, or 5 microns, or 7 microns, or 10 microns or more deeper than the depth of the p− region according to the application.

Figure 5:
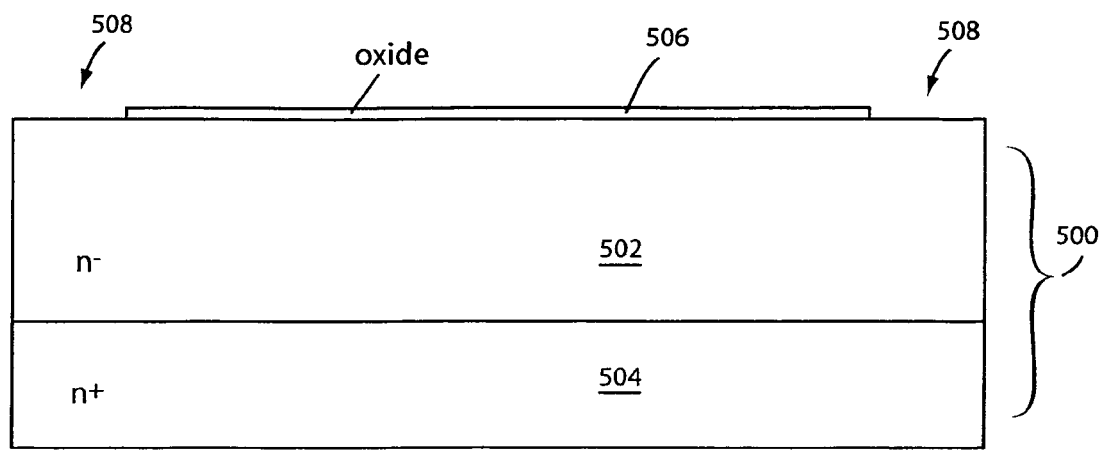
FIGS. 5-7 illustrates a process for manufacturing a FRED with very low leakage current according to one embodiment of the present invention.
Figure 6:
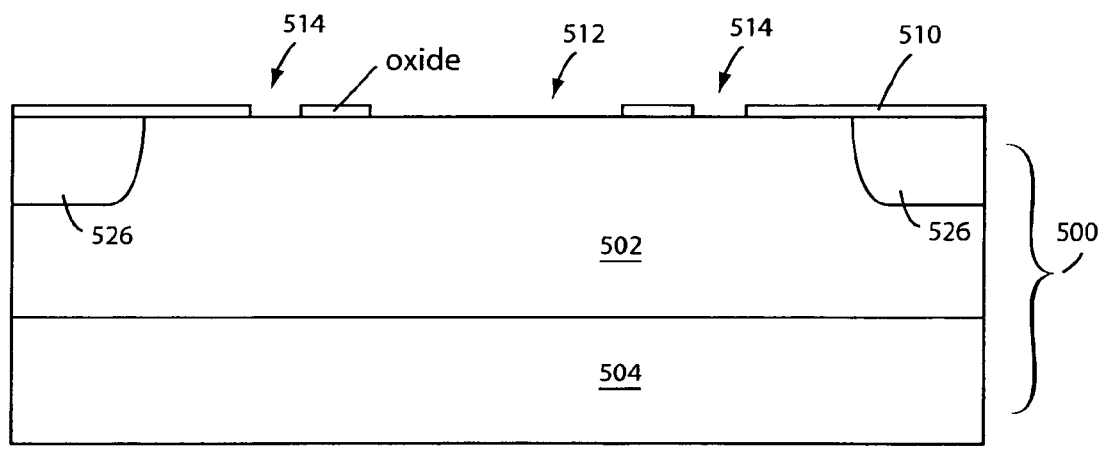
Figure 7:
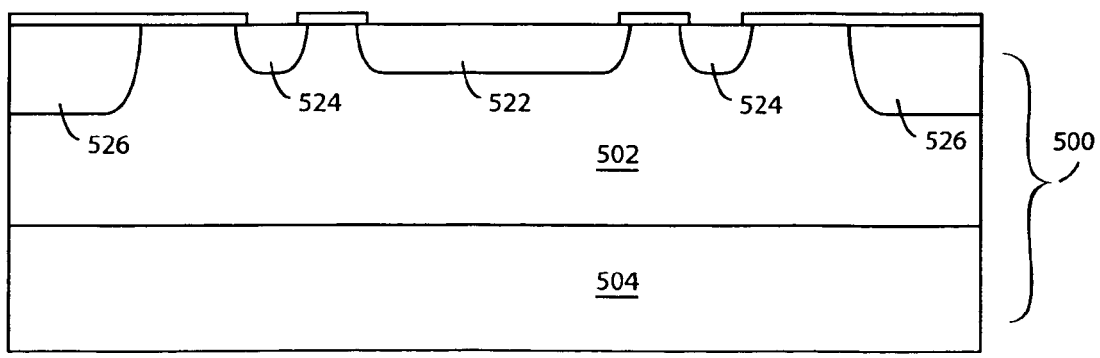

FIGS. 5-7 illustrate a process for manufacturing a fast switching diode with low leakage current according to one embodiment of the present invention. The process flow includes forming an n+ doping and drive-in steps prior to performing a p+ doping and drive-in steps, so the n-type dopants may be driven deeper into the substrate. As shown in FIG. 5, a semiconductor substrate 500 includes an n− layer 502 formed on top of an n+ layer 504. N-layer 502 is an epi-layer in the present embodiment. An oxide layer 506 is formed on the n− layer. The oxide is patterned to expose certain areas 508 of the n− layer to form the n+ region or channel stopper. The exposed areas 508 are doped with n-type dopants, e.g., phosphorus or arsenic. The dopants may be driven into the substrate by implantation or diffusion method.

In the present implementation, the silicon surface in the exposed areas 508 is doped with phosphorus in a prediffusion process. The wafer or substrate is heated to a temperature of 1050° C. for 2 hr in an ambient gas that contains POCl3 (phosphoroxychloride) as a diffusion source. During this process a phosphorus glass forms on the wafer surface, which is etched off after performing the prediffusion. Next, the wafer is heated at a temperature of 1100° C. for five hours in an ambient gas that contains oxygen. During this step the phosphorus atoms in the exposed areas 508 are driven deeper into the silicon, and at the same time another oxide layer 510 is formed (see FIG. 6).

Oxide layer 510 is patterned to expose areas 512 and 514 to form p+ regions. The p+ emitter region is formed using the exposed region 512, and a guard ring is formed using the exposed region 514. The n− layer includes, at its edges, the n+ region 516 that has a given depth due to the drive-in step described above.

P-type dopants, e.g., boron, are provided into exposed regions 512 and 514 (FIG. 7). The p-type dopants may be driven into the n− layer using implantation or diffusion method. In the present implementation, the diffusion method is used. The wafer is coated with a spin-on dopant that contains boronoxide. Then a prediffusion process is performed at 950° C. for 3 hr, followed by etching off the boronoxide layer. The wafer is heated at a temperature of 1150° C. for five hours. During this step the boron atoms in the exposed areas 512 and 514 are driven deeper into the silicon to form p+ regions 522 and 524. At the same time the n+ region 526 diffuses deeper into the n− layer 502.

A p+ emitter region 522 and a guard ring 524 is provided with the depth of 10 microns. An n+ region (or channel stopper) 526 is provided with the depth of 15 microns. The n+ region is considerably deeper than the p+ region since the former is exposed to two drive-in steps, one for the n+ drive-in step and another for p+ drive-in step. In the conventional step, the p+ doping and drive-in steps are performed prior to the n+ doping/drive-in step since the n+ region may have a relatively shallow depth, e.g., 1-2 microns.

After the emitter region and guard ring have been formed, a platinum layer is formed over the substrate. The substrate and platinum layer are heated to form a platinum silicide. The silicide is heated at 930° C. for 4 hours to provide the n− layer with high concentration of platinum. The platinum concentration level at the upper surface of the substrate 500 is 1.5 times, 2 times, 3, times, 4 times, 5 times or greater than that of the n-type concentration level, so that the upper part of the n− region is converted to a p− region and configure the diode to be extremely fast switching diode. The Pt concentration may be varied according to application, e.g., higher Pt concentration is provided for faster switching capabilities.

Accordingly, a p− region is formed at the upper region of the n− layer 502 (see FIG. 2). The depth of this p− region is provided to be less than that of n+ region 526. For example, the depth of the p− region may be 14 microns or less, or 12 microns or less, or 10 microns or less, 8 microns or less, 6 microns or less, or 4 microns or less according to the application.

The maximum allowed depth of the n+ region 526 is not limited by a trade-off with other electrical parameters of the diode in the present embodiment. If necessary, i.e., if the p− region needs to be deep, the depth of the n+ region can be made even deeper accordingly. In one embodiment, the n+ region 526 is 20 microns, or 15 microns, or 30 microns deep. The n+ region, in fact, may extend through the entire thickness of the n− layer, such that it is connected with the n+ layer 504 at the backside of the substrate.

Once the platinum has been driven into the substrate, the silicide is etched off. A passivation layer is formed over the substrate. Metal layers are formed on the upper and lower surfaces of the substrate to form anode and cathode electrodes.

The diode (e.g., diode 400) fabricated with above process exhibited an extremely low leakage current (e.g., less than 1 μA) at a reverse bias Vr of 600 volts at room temperature. Diode 400 is configured to be an extremely fast switching diode and is configured to be operated at a voltage up to 600 volts. Its fast switching speed is illustrated by the following test condition: A forward current of If=50 A (current density=4 A/mm2) is turned off with a negative dI/dt=100 A/μs to a reverse voltage of Vr=100 V. With this test condition the maximum allowed reverse recovery current Irm is specified as Irm<2 A (current density=0.16 A/mm2). The reverse recovery time trr (the time duration of the reverse current peak) was tested to be approximately 40 ns.

Figure 8:
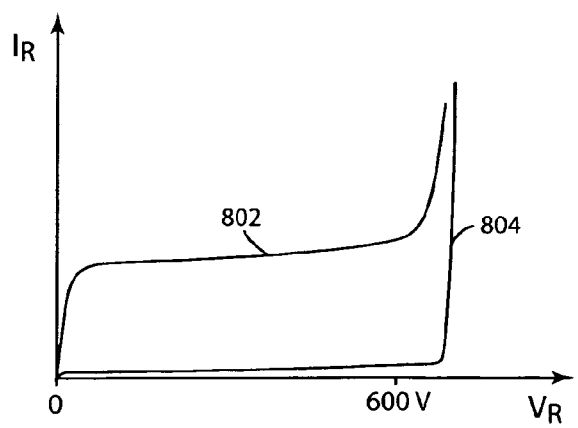
FIG. 8 illustrates a leakage current vs. reverse voltage for the FRED of FIG. 2 and the FRED of FIG. 4.

FIG. 8 illustrate a leakage current versus reverse voltage for diode 200 (FIG. 2) and diode 400 (FIG.4) that was manufactured using the process above. A graph 802 illustrates the leakage current of diode 200, which tends to be significant even at low reverse voltages. A graph 804 illustrates the leakage current of diode 400. Diode 400 maintains very low current leakage even at a reverse voltage well in excess of 600 volts.

The present invention has been described in terms of specific embodiments. Accordingly, the disclosed embodiment may be amended or modified without departing from the scope of the present invention.

What is claimed is:

1. A fast recovery diode, comprising:
   a first n-type layer having a first conductivity, the first n-type layer having an upper surface and a lower surface and a first edge and a second edge, the second edge provided on an opposing side of the first edge;
   a first p-type region provided proximate the upper surface of the first n-type layer and extending substantially the entire upper surface of the first n-type layer, the first p-type region having a first depth, the first p-type region including platinum;
   a first n-type region provided proximate the first edge of the first n-type layer and abutting an end of the first p-type region, the first n-type region extending from the upper surface of the first n-type layer to a second depth, the second depth being greater than the first depth to reduce leakage current;
   a first electrode provided proximate the upper surface of the first n-type layer; and
   a second electrode provided proximate the lower surface of the first n-type layer.

2. The diode of claim 1, further comprising:
   a second n-type layer having a second conductivity provided between the first n-type layer and the second electrode, wherein the second n-type layer has a higher conductivity than the first n-type layer,
   wherein the first and second n-type layers define a substrate, the first n-type layer has less conductivity than the second n-type layer, and
   wherein the first n-type region is a channel stopper.

3. The diode of claim 1, wherein the first p-type region is a converted region formed within the first n-type layer by providing the first n-type layer with platinum.

4. The diode of claim 3, wherein the first p-type region has a platinum concentration level that is substantially greater than that of a n-type dopant concentration level of the first n-type layer.

5. The diode of claim 3, wherein an upper surface of the first p-type region has a platinum concentration level that is at least two times that of a n-type dopant concentration level on the upper surface of the first p-type region.

6. The diode of claim 3, wherein an upper surface of the first p-type region has a platinum concentration level that is at least three times that of a n-type dopant concentration level on the upper surface of the first p-type region.

7. The diode of claim 1, wherein the second depth of the first n-type region is 15 microns or greater.

8. The diode of claim 1 wherein the second depth of the first n-type region is 20 microns or greater.

9. The diode of claim 1, further comprising:
   a second p-type region provided proximate the upper surface of the first n-type layer and in contact with the first electrode; and
   a second n-type region provided proximate the second edge of the first n-type layer and extending from the upper surface of the first n-type layer to a third depth, the third depth being greater than the first depth to reduce leakage current;
   wherein the first p-type region is a converted region provided to increase a switching speed of the diode, the second p-type region is an emitter region, the first electrode is an anode, the second electrode is a cathode, the first and second n-type regions are channel stoppers.

10. A fast switching diode, comprising:
    an n– layer having an upper surface and a lower surface and a first edge and a second edge, the second edge provided on an opposing side of the first edge;
    a converted region provided proximate the upper surface of the n– layer and extending substantially from the first edge to the second edge, the converted region including platinum and having a first depth, the converted region having a platinum concentration that is substantially greater than an n-type dopant concentration in the converted region;
    first and second n+ regions provided proximate the first and second edges of the n– layer, respectively, the first and second n+ regions being provided within the converted region and extending from the upper surface of the n– layer to second and third depths, respectively, the second and third depths each being greater than the first depth to reduce leakage current;
    a first electrode provided proximate the upper surface of the n– layer; and
    a second electrode provided proximate the lower surface of the n– layer.

11. The diode of claim 10, further comprising:
    an n+ layer provided between the n– layer and the second electrode,
    wherein the first and second n+ regions are channel stoppers, and
    wherein the second and third depths are 15 microns or greater.

12. The diode of claim 11, wherein the second and third depths each is 20 microns or greater.

13. The diode of claim 11, wherein the second and third depths each is 25 microns or greater.

* * * * *